(12) United States Patent
Ishizaka et al.

(10) Patent No.: US 7,560,748 B2
(45) Date of Patent: *Jul. 14, 2009

(54) LIGHT EMITTING DIODE UNIT

(75) Inventors: Mitsunori Ishizaka, Minamitsuru-gun (JP); Koichi Fukasawa, Kofu (JP); Sadato Imai, Hachiouji (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 223 days.

This patent is subject to a terminal disclaimer.

(21) Appl. No.: 11/589,282

(22) Filed: Oct. 30, 2006

(65) Prior Publication Data

US 2007/0102722 A1  May 10, 2007

(30) Foreign Application Priority Data

Nov. 2, 2005 (JP) .............................. 2005-320214

(51) Int. Cl.
  *H01L 29/22* (2006.01)
  *H01L 29/24* (2006.01)
(52) U.S. Cl. .................... 257/99; 257/98; 257/100; 257/431; 257/432; 438/27
(58) Field of Classification Search ........... 257/98–100, 257/431, 432; 438/27
See application file for complete search history.

(56) References Cited

U.S. PATENT DOCUMENTS

| | | | | |
|---|---|---|---|---|
| 4,729,031 A | * | 3/1988 | Saito et al. ................. 348/779 |
| 4,835,445 A | * | 5/1989 | Watanabe et al. ............. 315/58 |
| 6,924,514 B2 | * | 8/2005 | Suenaga ..................... 257/98 |
| 7,326,583 B2 | * | 2/2008 | Andrews et al. ............. 438/26 |
| 7,361,940 B2 | * | 4/2008 | Kim et al. ................... 257/99 |
| 7,375,381 B2 | * | 5/2008 | Shimizu et al. ............. 257/98 |
| 2004/0145688 A1 | * | 7/2004 | Mizutani et al. ........... 349/113 |
| 2004/0211970 A1 | * | 10/2004 | Hayashimoto et al. ....... 257/98 |
| 2005/0062059 A1 | * | 3/2005 | Huang ....................... 257/100 |
| 2005/0117351 A1 | * | 6/2005 | Kuisma .................... 362/373 |
| 2006/0157726 A1 | * | 7/2006 | Loh et al. .................. 257/100 |
| 2007/0138488 A1 | * | 6/2007 | Tasch et al. ................ 257/88 |
| 2008/0268559 A1 | * | 10/2008 | Jung ........................... 438/26 |

FOREIGN PATENT DOCUMENTS

JP    2002-270901    *  9/2002
JP    2005-136137       5/2005

* cited by examiner

*Primary Examiner*—Kenneth A Parker
*Assistant Examiner*—Joseph Nguyen
(74) *Attorney, Agent, or Firm*—Browdy and Neimark, P.L.L.C.

(57) ABSTRACT

A light emitting diode unit including a base (100) made of anodized aluminum and a printed board (101) attached to the base (100) and the printed board (101) including a predetermined conductive pattern (102) and an opening (101*a*) having an area for die-bonding at least one LED chip (113) to the base (100) through a transparent paste, an upper electrode of the at least one LED chip being wire-bonded to a conductive pattern (102) provided on the printed board (101) through a gold line (110), and a lens member (105) including at least two sealing resin-injection holes (106*c*) and being attached to the printed board (101) to form a space surrounding the at least one LED chip on the base, and the space being filled with the sealing resin by way of the resin-injection holes (106*c*) to seal the at least one LED chip.

12 Claims, 4 Drawing Sheets

LIGHT EMITTING DIODE UNIT

CROSS-REFERENCE TO THE RELATED APPLICATION

This application is based on and claims priority from Japanese Patent Application No. 2005-320214, filed on Nov. 2, 2005, the disclosure of which is incorporated herein by reference in its entirety.

BACKGROUND OF THE INVENTION

1. Field of the Invention

The present invention relates to a light emitting diode (LED) unit, more specifically to an LED unit configured to have high luminous efficiency, good heat release characteristics, durability and a simple and easily assembled structure.

2. Description of Related Art

In recent years, there has been a notable trend toward development of increasingly high output LEDs for use in various appliances, such as OA instruments, indicator lamps for vehicle instruments, indicator lamps for traffic signals, front lights and the like. However, increasing the amount of light emitted from an LED unit also increases the heat generated within the LED chip, leading to a lowering in luminous efficiency of the LED unit. Moreover, an LED unit including a resinous reflector to enhance reflection efficiency of light emitted from an LED chip has low reflection efficiency because the reflector is deteriorated due to the significant rise in temperature within the LED unit. Furthermore, if an LED chip is mounted on a metallic base, there is a problem that the LED chip may become separated from the base. Therefore, proposals have been made for an LED unit which can provide improvements in heat release property, and can prevent heat-induced deterioration of the reflector and heat-induced separation of the LED chip from the base (for reference, see Japanese Patent Laid-Open No. 2005-136137, page 4, FIG. 1).

FIGS. 5 and 6 illustrate an LED unit disclosed in Japanese Patent Laid-Open No. 2005-136137.

The LED unit includes a base 1, a case 2 attached to the base 1, an LED chip 3 supported on the base 1, and a lens section 4 which is disposed above the LED chip 3 and attached to the case 2, as shown in FIGS. 5 and 6.

The case includes a central hole 2a in which the base 1 is inserted and a concave portion 2b which includes an inclined surface continuing to the central hole 2a, and has a rectangular outer shape. A surface treatment such as silver plating to reflect light emitted from the LED chip 3 is applied to a surface of the concave portion 2b. A first electrode 5 and a second electrode 6 each of which is formed by a conductive film are disposed on an upper surface of the base 1. The first and second electrodes 5 and 6 are adhered to the base 1 by an insulative adhesive. An end portion 7a of a first lead 7 is connected to the first electrode 5 and an end portion 8a of a second lead 8 is connected to the second electrode 6 (see FIG. 6).

The first and second leads 7 and 8 are adhered to the case 2 by an insulative adhesive such as low-melting point glass.

The LED chip 3 is mounted on the first electrode 5 and adhered to the first electrode 5 by a conductive adhesive such as a silver paste, thereby allowing a lower surface electrode of the LED chip 3 to be electrically connected through the first electrode 5 to the first lead 7. On the other hand, an upper surface electrode of the LED chip 3 is electrically connected through a bonding wire 9 to the second electrode 6.

As described above, in the LED unit as shown in FIGS. 5 and 6, the LED chip 3 is disposed on the first electrode 5 and light emitted from the LED chip 3 is reflected on the inclined surface of the concave portion 2b.

However, in the above-mentioned LED unit, because the LED chip 3 is disposed on the first electrode 5, the problems arise that it is difficult to release the heat of the LED chip 3 to the exterior through the base 1, and that the surface of the concave portion 2b to which the silver plating treatment is applied receives a relatively large amount of direct heat from the LED chip and may become oxidized or sulfurized, leading to a reduction in reflection efficiency of the surface.

SUMMARY OF THE INVENTION

An object of the present invention is to provide a light emitting diode (LED) unit which is capable of rapidly releasing heat from an LED chip to the exterior, is easily assembled, and achieves high luminous efficiency and a stable long-term performance.

To accomplish the above object, a light emitting diode unit according to one embodiment of the present invention includes a base made of a material having high heat conductivity, and a printed board disposed on the base.

The printed board includes a predetermined conductive pattern and an opening passing through the printed board. At least one LED chip is disposed on the base within the opening of the printed board and electrically connected to the conductive pattern. A lens member is disposed on the printed board to cover the LED chip. The lens member includes at least two sealing resin-injection holes to inject a sealing resin in a space provided between the LED chip disposed on the base and the lens member.

In the above-mentioned structure, the sealing resin is injected in the space between the lens member and the LED chip through the injection hole to seal the LED chip.

In one embodiment, the base is made of a material having high heat conductivity, for example, an anodized aluminum plate.

DETAILED DESCRIPTION OF THE PREFERRED EMBODIMENTS

Preferred embodiments of the present invention will be explained in detail with reference to the accompanying drawings below.

Figure 1:
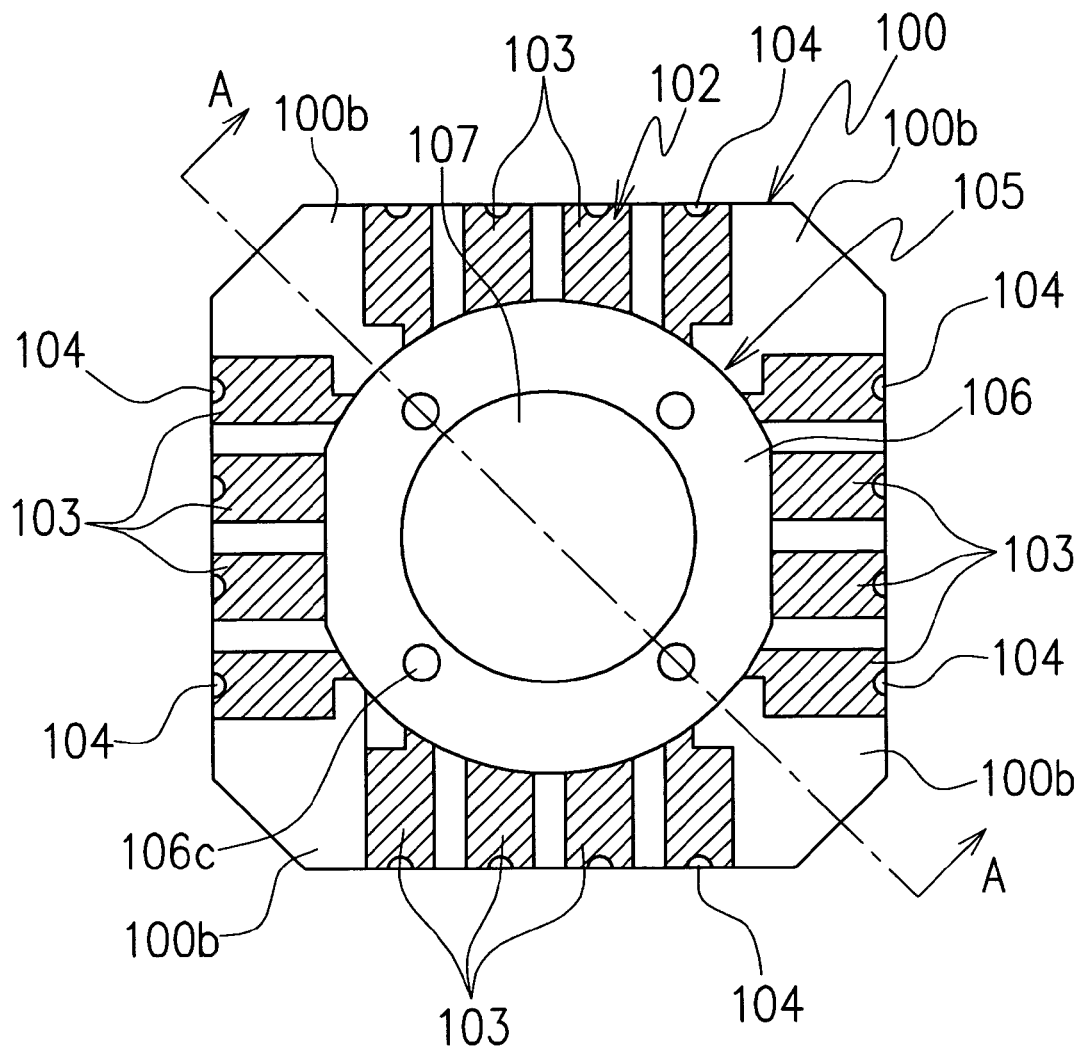
FIG. 1 is a plan view showing a first embodiment of an LED unit according to the present invention.
Figure 2:
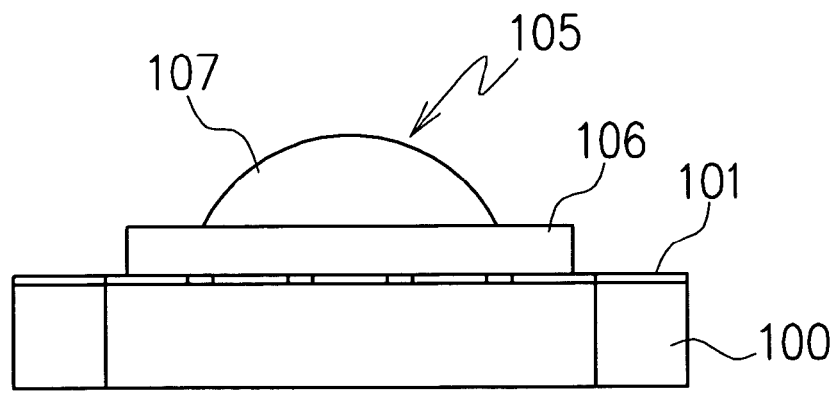
FIG. 2 is a side elevational view of FIG. 1.
Figure 3:
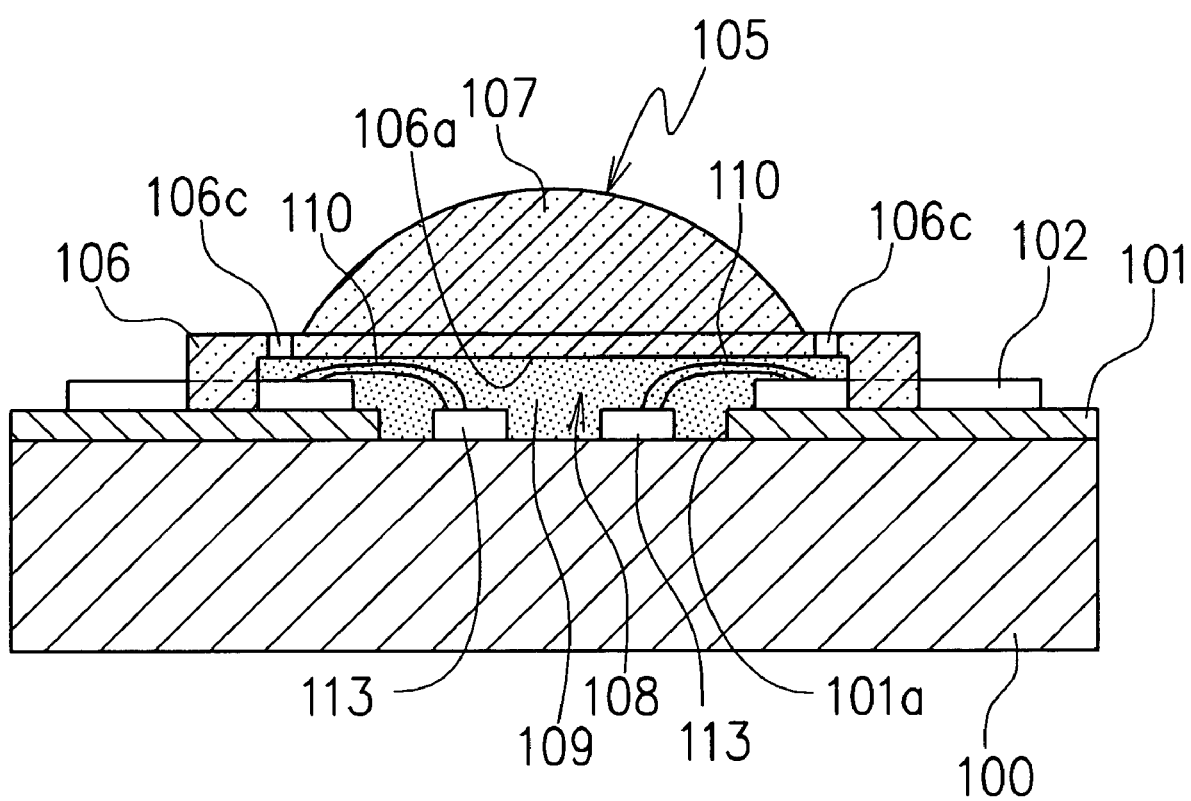
FIG. 3 is a sectional view taken along the A-A line in FIG. 1.

FIGS. 1 to 3 illustrate a first embodiment of an LED unit according to the present invention.

The LED unit in the first embodiment includes a base 100 having, for example, a generally rectangular outer shape (see FIGS.1 and 2). The base 100 is made of a material having high heat conductivity, for example, an anodized aluminum plate.

A printed board 101 having a generally same shape as that of the base 100 is disposed on an upper surface of the base 100. The printed board 101 includes a predetermined conductive pattern 102 which is formed on an upper surface thereof (see FIGS. 1 and 3). The conductive pattern 102 includes a plurality of pattern areas 103 disposed on, for example, four sides of the rectangular printed board 101. A plurality of through-hole electrodes 104 making contact with their respective pattern areas 103 are provided in outer edges of the printed board 101 (see FIG. 1).

An opening 101a passing through the printed board 101 is provided in a generally central portion of the printed board 101 (see FIG. 3).

At least one LED (light emitting diode) chip 113 is mounted on the base 100 (see FIG. 3). In the illustrated embodiment, two LED chips 113 are attached to the base 100, as shown in FIG. 3.

As shown in FIG. 3, each of the LED chips 113 is mounted on the base 100 within the opening 101a of the printed board 101, and die-bonded to the base 100 through, for example, a transparent paste, in one case a silicone die-bond paste. After the LED chips 113 are die-bonded to the base 100, upper electrodes of each of the LED chips 113 are electrically connected to the conductive pattern 102 provided on the printed board 101 through bonding wires, for example, gold wires 110.

A lens member 105 is disposed to cover the LED chips 113 and attached to the upper surface of the printed board 101. The lens member 105 includes a case 106 having a concave portion 106a configured to cover the LED chip 113 and a lens section 107 provided on an outer surface of the case 106 opposite the concave portion 106a. In the illustrated embodiment, the case 106 and the lens section 107 are integrally formed. The lens section 107 has a predetermined curvature. The case 106 is mounted on the printed board 101 in such a manner that an inner surface of the concave portion 106a is disposed to face an emission surface of each of the LED chips 113 (see FIG. 3).

In this case, it is preferable that some parts of a circumferential edge portion of the case 106 are disposed on portions of the printed board 101 at which the conductive pattern 102 is not provided, for example, corner portions 100b (see FIG. 1) of four corners of the printed board 101. Here, a resist film having a generally same thickness as that of the conductive pattern 102 is preferably provided on each of the corner portions of the printed board 101 making contact with the lens member 105. Provision of the resist film having the generally same thickness as that of the conductive pattern 102 on the printed board 101 means that the surface of the resist film and the surface of the conductive pattern 102 are set on a uniform level and allows stable attachment of the lens member 105 to the printed board 101.

Furthermore, it is preferable to use a UV hardening adhesive or the like to bond the lens member 105 to the printed board 101.

When the lens member 105 is attached to the printed board 101, a space 108 is formed between the case 106 and the base 100 (see FIG. 3).

The lens member 105 is preferably made of a silicone-type resin and has at least two, in this example, four resin-injection holes 106c which are provided in an outer circumferential portion of the case 106 (see FIGS. 1 and 3).

An appropriate resin is injected in the space 108 through the resin-injection holes 106c to form a sealing resin 109 and to seal the LED chips 113.

It is preferable to use one selected from a soft rubber silicone resin and a gel-type silicone resin for the sealing resin 109 which seals the LED chips 113 mounted on the base 100.

If the silicone resin contains a fluorescent material or a diffusion material therein, it offers better protection against deterioration caused in an ultraviolet region.

What is more, surface corrosion of the base 100 caused by oxidation is prevented by anodizing the aluminum plate, and high reflectance can be achieved by forming a further multilayer coating film on top of the anodized aluminum surface. In addition, the base 100 according to the present invention may be made of an aluminum coated copper plate instead of the aluminum plate which has undergone anodization. Also, it is better to anodize the aluminum coated copper plate. Further, a white paste containing titanium oxide, instead of the transparent paste, may be used for the adhesion of the LED chips 113 to the base 100.

Next, operation of the LED unit with the above-mentioned structure is explained.

In the first embodiment, light emitted from the LED chips 113 passes through the sealing resin 109 to the lens member 105 and is collected by the lens section 107 of the lens member 105 to be emitted to the exterior of the LED unit.

Here, because the base 100 configured to have the LED chips 113 mounted thereon is comprised of the anodized aluminum plate or aluminum coated copper plate, the base has a good corrosion-resisting property. In addition, because heat released from the LED chips 113 is transmitted directly to the base 100, rapid heat release can be achieved by the base 100.

Moreover, because the LED chips 113 and the sealing resin 109 are covered in their entirety by the lens member 105, it is possible to use a soft rubber-type silicone resin for the sealing resin 109. Using a soft sealing resin in this way means that an internal stress of the sealing resin can be released and a high temperature cycle property can be achieved.

Furthermore, because the silicone resin which has high moisture permeability is used for the sealing resin 109 and the lens member 105, and almost all moisture in the resin is removed during pre-heat reflow vaporization, it is difficult for a steam explosion to occur at the time of peak temperature and the moisture-absorbing reflow-resistance property is enhanced.

In addition, because the sealing resin 109 is injected through the resin-injection holes 106c, it is possible to maintain the amount of injected resin at a fixed level and to accomplish formation of the sealing resin with ease. In particular, if the injected resin is white, variation in the fluorescent material or the diffusion material is reduced.

Figure 4:
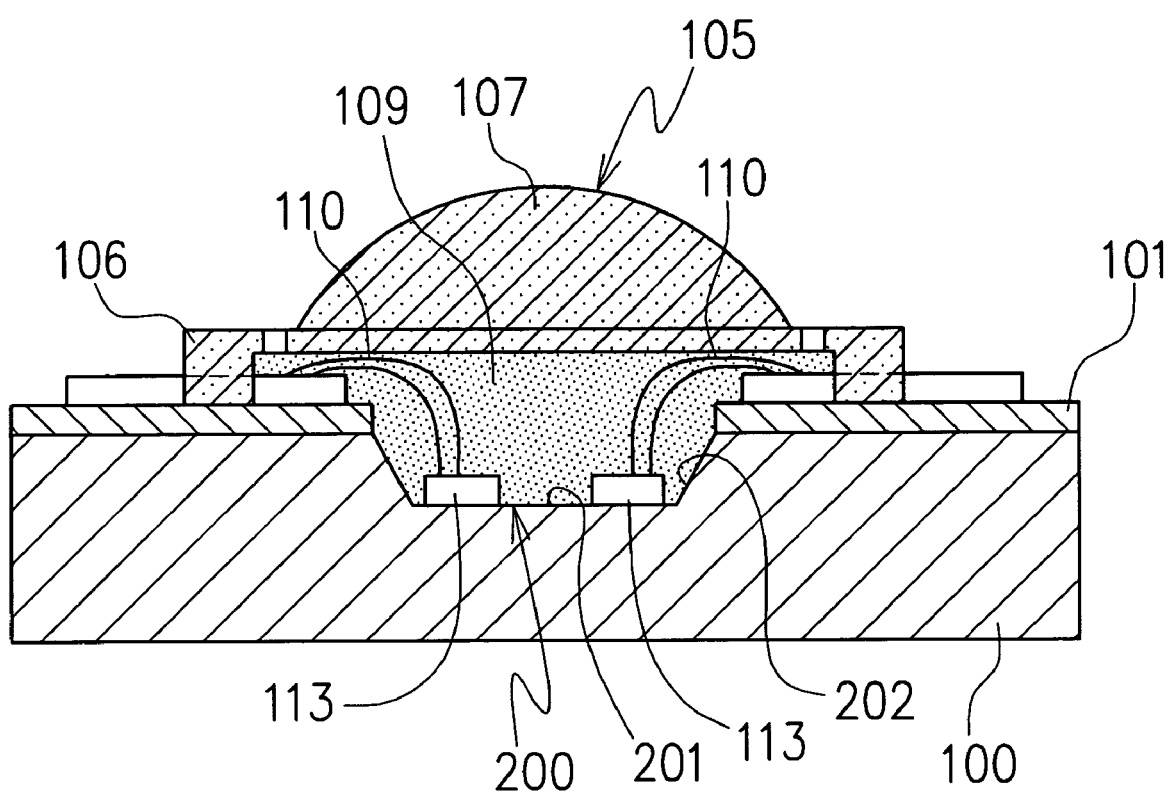
FIG. 4 is a sectional view showing a second embodiment of an LED unit according to the present invention.
Figure 5:
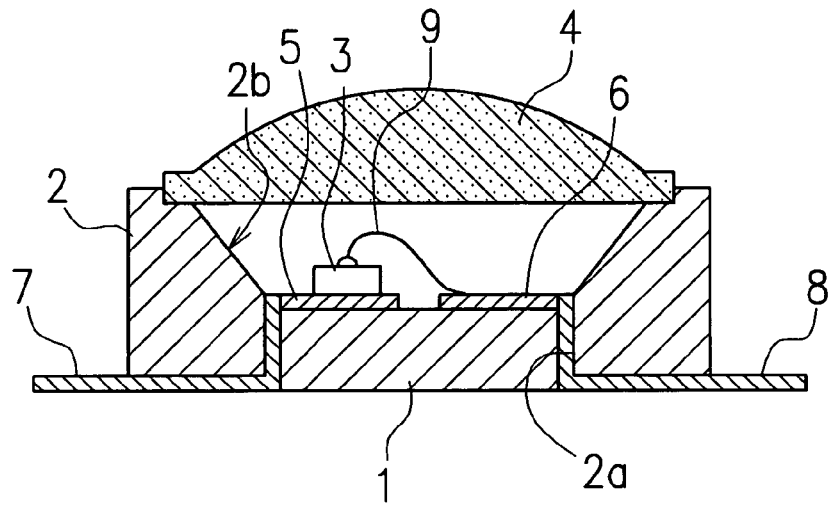
FIG. 5 is a sectional view showing a conventional LED unit.
Figure 6:
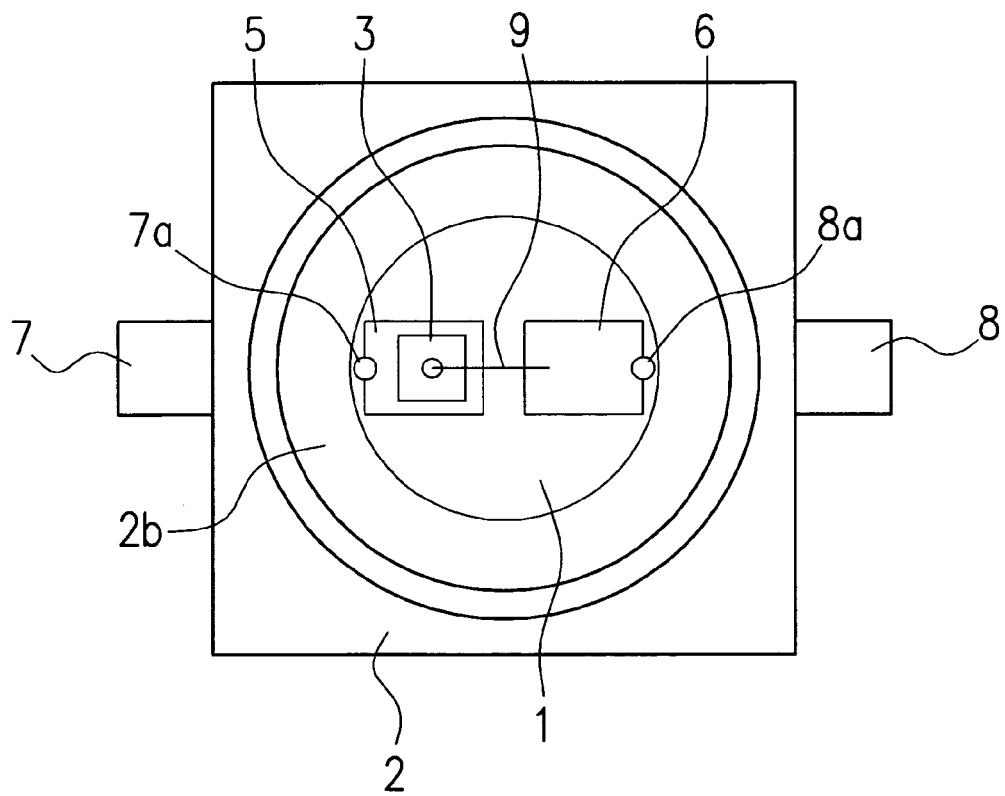
FIG. 6 is a top plan view of FIG. 5.

FIG. 4 illustrates a second embodiment of the LED unit according to the present invention.

The LED unit in the second embodiment differs from that in the first embodiment in that a concave portion 200 including a bottom surface 201 and an inclined surface 202 extending upward from a periphery of the bottom surface is provided in a mounting portion of the base 100 for mounting of the LED chips 113 therein.

The inclined surface 202 is configured to reflect light emitted from the LED chips 113 and to direct the reflected light toward the lens member 105.

In this second embodiment, the upper surface of the base 100 including the concave portion 200 is anodized and a multilayer coating film to increase reflectivity is preferably applied on top of the anodized aluminum surface. When the multilayer coating film is provided in this way, the concave portion 200 achieves a high reflection characteristic which can be maintained for a longer period.

In addition, in the second embodiment, the white paste containing titanium oxide is used to bond the LED chips 113 to the base 100, in the same way as in the first embodiment, and this enhances heat conductivity and the heat release property.

Because the base 100 for mounting the LED chips 113 thereon is comprised of an anodized aluminum plate or an aluminum coated copper plate, the base 100 has a good corrosion-resisting property.

Furthermore, in the second embodiment, a white paste containing titanium oxide is used to bond the LED chips 113 to the base 100 leading to enhanced heat conductivity and heat release, and achieving a reduction in variation for light reflectance of the reflection cup.

As mentioned above, in the LED unit in each of the first and second embodiments, because the base for mounting the LED chips thereon is comprised of an aluminum plate with an anodized aluminum surface or aluminum coated copper plate, the LED unit has a good corrosion-resisting property. In addition, because the LED chips are attached to the base, the heat of the LED chips is transmitted directly to the base so that rapid heat release can be expected.

Because the concave portion including the inclined reflective surface is formed in the base for mounting the LED chips therein, light emitted from the LED chips can be reflected in the concave portion effectively. In addition, because the multilayer coating film is formed on the anodized aluminum surface of the base, the reflection efficiency of the concave portion can be further enhanced.

Although the preferred embodiments of the present invention have been described, the present invention is not limited to these embodiments and it should be noted that various modifications and changes can be made to the embodiments.

What is claimed is:

1. A light emitting diode unit, comprising:
   a base made of a material having a high heat conductivity;
   a printed board including a predetermined conductive pattern and an opening, and disposed on the base;
   at least one light emitting diode chip disposed on the base within the opening of the printed board and electrically connected to the conductive pattern;
   a lens member including a lens section configured to collect light emitted from the light emitting diode chip and a case having a concave portion that covers the light emitting diode chip and is attached to the printed board to create a space between the light emitting diode chip and the lens member, the lens section being provided on an outer surface of the case opposite to the concave portion; and
   a sealing resin filling the space and configured to seal the light emitting diode chip,
   the case including at least two sealing resin-injection holes adapted to fill the space with the sealing resin.

2. The light emitting diode unit according to claim 1, wherein the base is made of anodized aluminum.

3. The light emitting diode unit according to claim 1, wherein the base is made of an aluminum coated copper plate.

4. The light emitting diode unit according to claim 1, wherein the light emitting diode chip is die-bonded to the base through a transparent paste.

5. The light emitting diode unit according to claim 4, wherein the transparent paste is a silicone die-bonding paste.

6. The light emitting diode unit according to claim 1, wherein the light emitting diode chip is die-bonded to the base through a white paste containing titanium oxide.

7. The light emitting diode unit according to claim 1, wherein the lens member is made of a silicone resin.

8. The light emitting diode unit according to claim 7, wherein the silicone resin is made of one selected from a rubber silicone resin and a gel-type silicone resin.

9. The light emitting diode unit according to claim 1, wherein a fluorescent material and a diffusion material are contained in the sealing resin.

10. The light emitting diode unit according to claim 1, wherein the lens member is attached to the printed board through a resist film.

11. The light emitting diode unit according to claim 1, wherein a concave portion having a bottom surface and an inclined surface extending upward from a periphery of the bottom surface is provided in the base and the at least one light emitting diode is mounted on the base at the bottom surface of the concave portion.

12. A light emitting diode unit, comprising:
   a base made of an anodized aluminum plate;
   a printed board disposed on an upper surface of the base and including a predetermined conductive pattern and an opening;
   at least one light emitting diode chip disposed on the base within the opening of the printed board and electrically connected to the conductive pattern;
   a lens member including a lens section configured to collect light emitted from the light emitting diode chip and a case having a concave portion that covers the light emitting diode chip and is attached to the printed board to create a space between the light emitting diode chip and the lens member; and
   a sealing resin filling the space and configured to seal the light emitting diode chip,
   the case including at least two sealing resin-injection holes adapted to fill the space with the sealing resin, and
   a multilayer coating film to increase reflectivity being formed on the upper surface of the base.

* * * * *